(12) United States Patent
Nowell et al.

(10) Patent No.: US 12,142,861 B2
(45) Date of Patent: Nov. 12, 2024

(54) CONNECTING MULTI-CONDUCTOR CABLES WITH SURFACE CONTACTS

(71) Applicant: Cisco Technology, Inc., San Jose, CA (US)

(72) Inventors: Mark C. Nowell, Ottawa (CA); D. Brice Achkir, Livermore, CA (US); Joel R. Goergen, Soulsbyville, CA (US); Giovanni Giobbio, Rovellasca (IT); Mary K. Laue, Atlanta, GA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 18/163,125

(22) Filed: Feb. 1, 2023

(65) Prior Publication Data
US 2023/0178915 A1    Jun. 8, 2023

Related U.S. Application Data

(63) Continuation of application No. 17/644,999, filed on Dec. 17, 2021, now Pat. No. 11,916,324.

(60) Provisional application No. 63/219,652, filed on Jul. 8, 2021.

(51) Int. Cl.
*H01R 12/72*      (2011.01)
*H01R 13/6594*    (2011.01)

(52) U.S. Cl.
CPC ....... *H01R 12/721* (2013.01); *H01R 13/6594* (2013.01)

(58) Field of Classification Search
CPC . H01R 12/721; H01R 13/6594; H01R 13/648
USPC .......................................................... 439/68
See application file for complete search history.

(56) References Cited

U.S. PATENT DOCUMENTS

| | | | | |
|---|---|---|---|---|
| 6,607,308 B2* | 8/2003 | Dair | ..................... | G02B 6/4277 385/92 |
| 6,659,655 B2* | 12/2003 | Dair | ..................... | G02B 6/4246 385/92 |
| 7,180,265 B2* | 2/2007 | Naskali | ................... | H02J 50/10 320/108 |
| 9,583,886 B2* | 2/2017 | Phillips | ................ | H01R 13/516 |
| 9,620,907 B1* | 4/2017 | Henry | ................ | H01R 13/6582 |
| 9,748,697 B2* | 8/2017 | Patel | ....................... | H05K 1/023 |
| 10,141,094 B2* | 11/2018 | Ozana | ................... | H01F 27/085 |
| 10,862,352 B2* | 12/2020 | Lin | .......................... | H02J 50/10 |

(Continued)

FOREIGN PATENT DOCUMENTS

| | | | |
|---|---|---|---|
| CN | 102570128 A | * | 7/2012 |
| CN | 203562800 U | * | 4/2014 |

(Continued)

*Primary Examiner* — Peter G Leigh
(74) *Attorney, Agent, or Firm* — Patterson + Sheridan, LLP

(57) ABSTRACT

A system includes a cage and a first coil. The cage includes a first end and a second end opposite the first end. The first end is arranged to receive an electrical connector. The second end is arranged to receive a pluggable module such that the electrical connector forms an electrical connection with the pluggable module. The first coil is positioned on or in the cage such that the first coil is arranged to deliver electric power to the pluggable module by inducing an electric current in a second coil positioned in or on the pluggable module when the pluggable module is connected to the electrical connector in the cage.

18 Claims, 14 Drawing Sheets

(56) References Cited

U.S. PATENT DOCUMENTS

| | | | | |
|---|---|---|---|---|
| 2011/0227527 A1* | 9/2011 | Zhu | ............... | H02J 50/90 |
| | | | | 320/108 |
| 2013/0288526 A1* | 10/2013 | Rascon | ............ | H01R 13/6586 |
| | | | | 439/607.35 |
| 2014/0007594 A1* | 1/2014 | Lofy | ............... | H05K 7/20209 |
| | | | | 62/3.2 |
| 2015/0097519 A1* | 4/2015 | Chen | ............... | H02J 7/02 |
| | | | | 320/108 |
| 2016/0211624 A1* | 7/2016 | Long | ............... | H01R 13/46 |
| 2017/0110902 A1* | 4/2017 | Miller | ............... | H02J 7/0044 |
| 2017/0164518 A1* | 6/2017 | Morgan | ............... | G02B 6/43 |
| 2017/0285282 A1* | 10/2017 | Regnier | ............ | G02B 6/3879 |
| 2018/0049348 A1* | 2/2018 | Bucher | ............ | H05K 7/20445 |
| 2018/0310435 A1* | 10/2018 | Sharf | ............... | H05K 7/1092 |
| 2020/0015385 A1* | 1/2020 | Bucher | ............ | H05K 7/20418 |
| 2020/0076455 A1* | 3/2020 | Sharf | ............... | G02B 6/4277 |
| 2020/0091755 A1* | 3/2020 | Larsson | ............ | H02J 7/0044 |
| 2020/0221607 A1* | 7/2020 | Bucher | ............ | H01R 12/716 |

FOREIGN PATENT DOCUMENTS

| | | | | | |
|---|---|---|---|---|---|
| CN | 104333060 | A | * | 2/2015 | |
| CN | 105827020 | A | * | 8/2016 | |
| CN | 107452460 | A | * | 12/2017 | ......... H01F 17/0013 |
| CN | 112769254 | A | * | 5/2021 | |

* cited by examiner

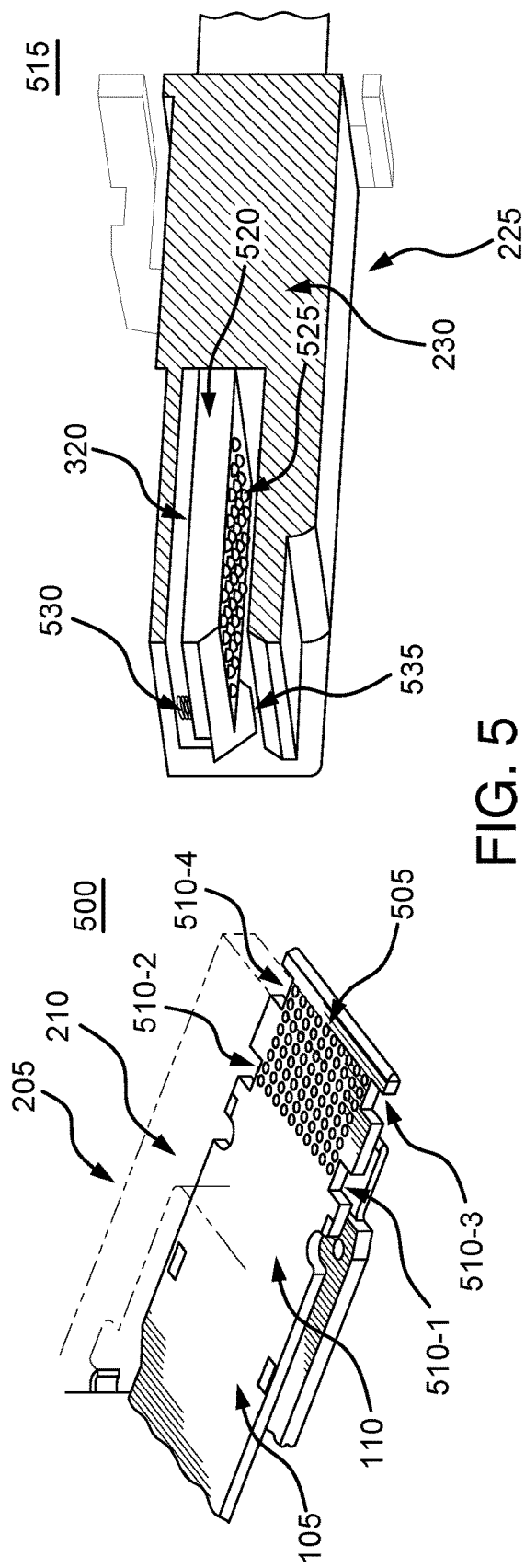
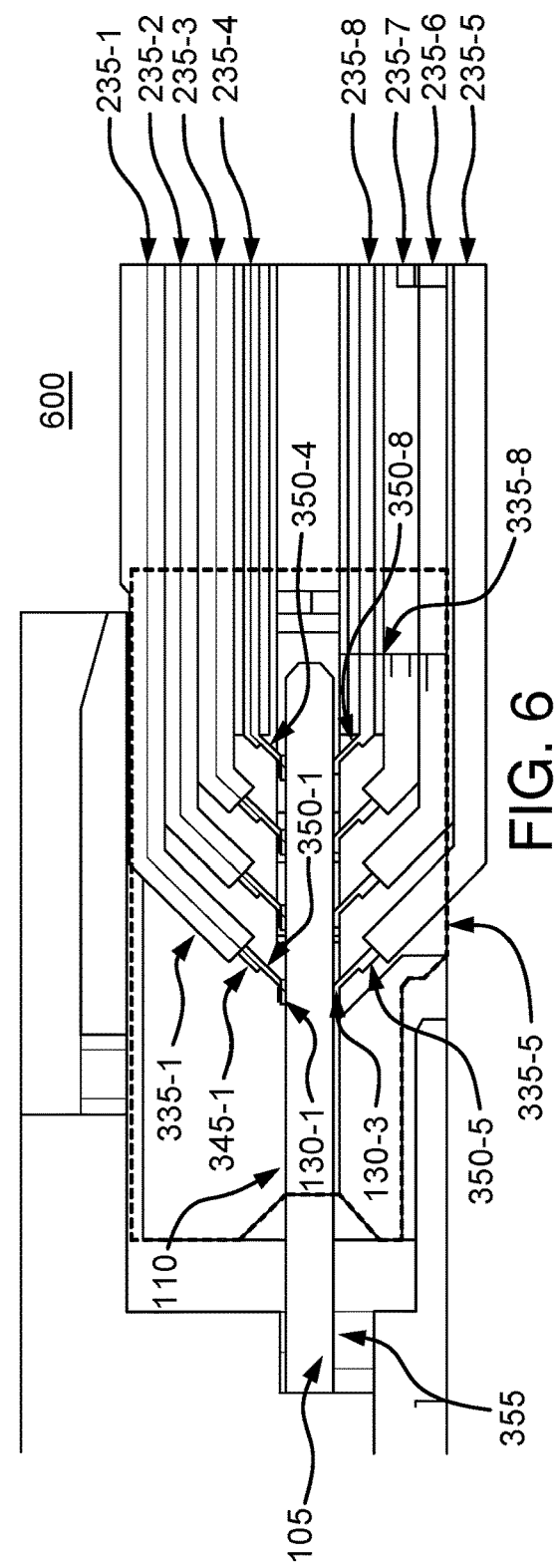

CONNECTING MULTI-CONDUCTOR CABLES WITH SURFACE CONTACTS

CROSS-REFERENCE TO RELATED APPLICATIONS

This application is a continuation-in-part of co-pending U.S. patent application Ser. No. 17/644,999 filed Dec. 17, 2021, which claims benefit of U.S. provisional patent application Ser. No. 63/219,652 filed Jul. 8, 2021. The aforementioned related patent application is herein incorporated by reference in its entirety.

TECHNICAL FIELD

Embodiments presented in this disclosure generally relate to electrical connector design, and more specifically, to implementations of electrical connectors capable of connecting multi-conductor cables with one or more arrays of surface contacts.

BACKGROUND

Edge connectors are routinely used to connect electrical cabling with printed circuit boards (PCBs) of networking devices such as pluggable optical modules and pluggable electrical modules. With an increased speeds of the electrical signals to support greater data rates, the performance limitations of existing electrical connectors have become more significant.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting, other equally effective embodiments are contemplated.

FIG. 5 illustrates complementary features of a printed circuit board and an electrical connector, according to one or more embodiments.

FIG. 6 illustrates connection with surface contacts on opposing surfaces of a printed circuit board, according to one or more embodiments.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
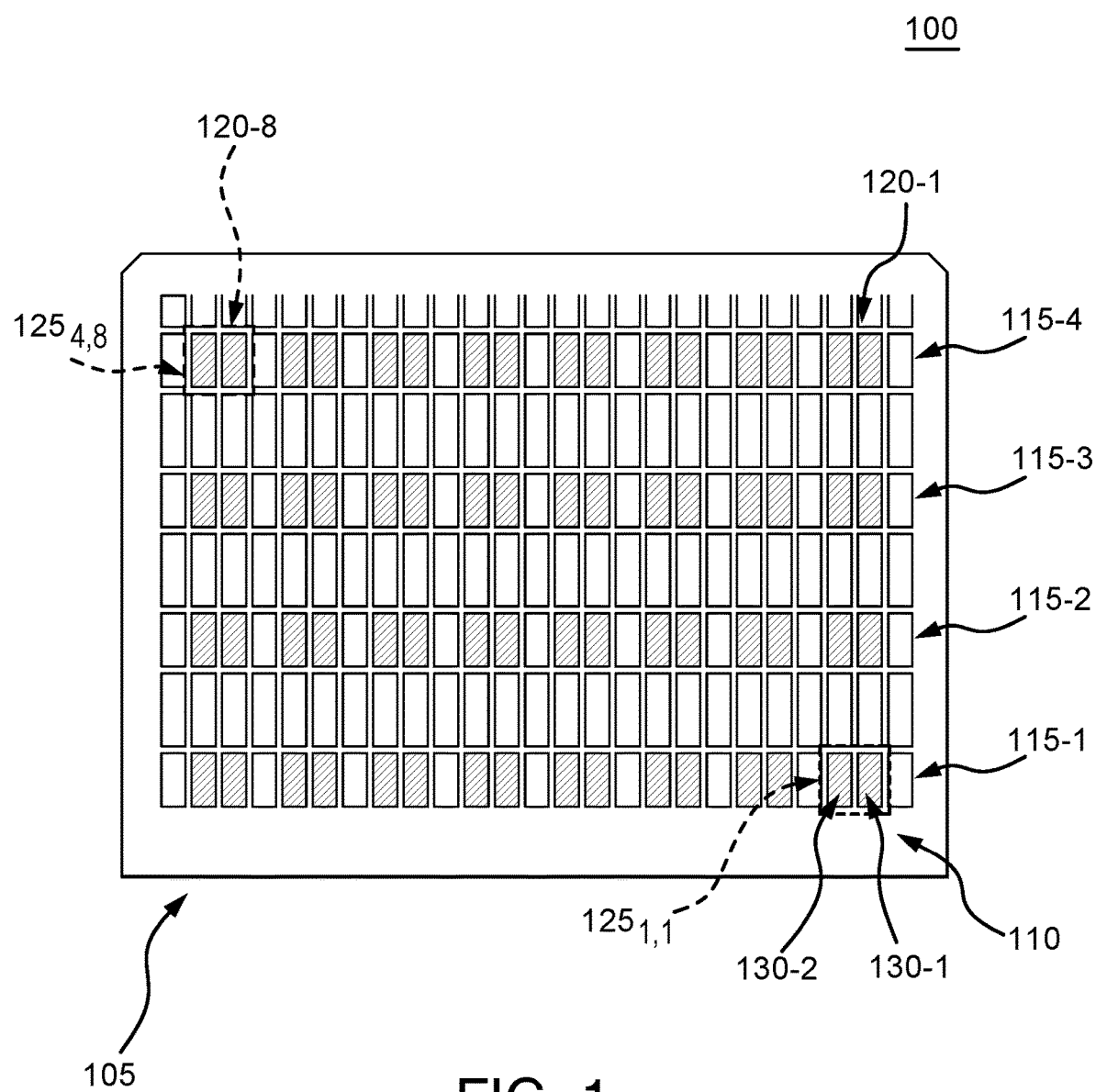
FIG. 1 illustrates an array of surface contacts disposed on a surface of a printed circuit board, according to one or more embodiments.

According to an embodiment, a system includes a cage and a first coil. The cage includes a first end and a second end opposite the first end. The first end is arranged to receive an electrical connector. The second end is arranged to receive a pluggable module such that the electrical connector forms an electrical connection with the pluggable module. The first coil is positioned on or in the cage such that the first coil is arranged to deliver electric power to the pluggable module by inducing an electric current in a second coil positioned in or on the pluggable module when the pluggable module is connected to the electrical connector in the cage.

According to another embodiment, a system includes a cage, a heatsink, and a first coil. The cage includes a first end and a second end opposite the first end. The first end is arranged to receive an electrical connector. The second end is arranged to receive a pluggable module such that the electrical connector forms an electrical connection with the pluggable module. The heatsink is positioned on the cage. The heatsink is arranged to absorb heat from the pluggable module when the pluggable module is positioned in the cage. The first coil is positioned on or in the heatsink such that the first coil is arranged to deliver electric power to the pluggable module by inducing an electric current in a second coil positioned in or on the pluggable module when the pluggable module is connected to the electrical connector in the cage.

According to another embodiment, a system includes a cage and a first coil. The cage includes a first end and a second end opposite the first end. The first end is arranged to receive an electrical connector. The second end is arranged to receive a pluggable module such that the electrical connector forms an electrical connection with the pluggable module. The first coil is positioned on or in the electrical connector such that the first coil is arranged to deliver electric power to the pluggable module by inducing an electric current in a second coil positioned in or on the pluggable module when the pluggable module is connected to the electrical connector in the cage.

EXAMPLE EMBODIMENTS

According to one or more embodiments, an electrical connector is disclosed for connecting to an array of surface contacts. The electrical connector comprises a connector body defining an interior volume. The connector body comprises an external surface defining a plurality of cable openings each configured to receive a respective multi-conductor cable therethrough, and a plurality of passageways each corresponding to a respective cable opening of the plurality of cable openings. Each passageway comprises a respective first section extending into the interior volume from the respective cable opening, where the first sections of the plurality of passageways are parallel with each other. Each passageway further comprises a respective second section extending from the respective first section toward a first plane of the surface contacts when the array is received into a connection position in the interior volume. The electrical connector further comprises a plurality of cable terminators each configured to couple with a respective multi-conductor cable exiting the second section of a respective passageway. Each cable terminator comprises a plurality of pins each configured to couple with a respective conductor of the multi-conductor cable and to extend to a respective contact surface. The contact surfaces of the plurality of cable terminators extend to a second plane that is coplanar with the first plane when the array is in the connection position.

Within the electrical connector, the first sections and second sections of the passageways provide a "flyover" configuration of the multi-conductor cables, which generally permits the multi-conductor cables to be spaced further apart from the surface contacts and any other components at or near the surface. Thus, the flyover configuration tends to provide improved signal integrity when transmitting higher-speed electrical signals. The flyover configuration further allows the surface contacts and the electrical connector to be scaled to support greater channel counts (e.g., a two-dimensional array of surface contacts) and/or greater contact density. The flyover configuration further supports fewer transitions between the multi-conductor cables and the surface contacts, which improves signal integrity.

In some embodiments, the array of surface contacts are disposed on a first surface of a printed circuit board (PCB), such as a top surface. The PCB may include a second array of surface contacts disposed on a second surface opposite the first surface, and the electrical connector may include a second plurality of cable terminators that contact the second array of the surface contacts. In some embodiments, the array of surface contacts are disposed on a top surface of an integrated circuit (IC) or of another base.

In some embodiments, a compressive force is applied between the plurality of cable terminators and the array of surface contacts when the array is in the connection position. For example, the cable terminators may use a spring-like termination (e.g., land grid array (LGA)-style) and contact an edge of the PCB that has been inserted into the connector to align the array of surface contacts with the cable terminators.

In certain embodiments, the PCB is provided as part of a pluggable module. The pluggable module and the electrical connector are connected to each other within a cage that provides a frame or support structure for the pluggable module and the electrical connector. Heatsinks may also be provided on the cage to absorb heat from the pluggable module during operation. Electric power is wirelessly provided to the pluggable module. For example, a transmission circuit may be provided on or in the cage, the heatsink, or the electrical connector. The transmission circuit may include a coil that induces an electric current in another coil positioned on or in the pluggable module. The induced current may provide electric power to the pluggable module.

FIG. 1 illustrates an array of surface contacts disposed on a surface of a printed circuit board (PCB) 105. More specifically, FIG. 1 provides a top view of a first surface 110 of a PCB 105, such that the first surface 110 is a top surface of the PCB 105. In alternate embodiments, the first surface 110 may be a bottom surface of the PCB 105. In alternate embodiments, the first surface 110 may represent a surface of an integrated circuit, a base, a platform, and so forth.

The first surface 110 comprises an array of surface contacts at a plurality of locations $125_{1,1}, \ldots, 125_{4,8}$. As shown, the plurality of locations $125_{1,1}, \ldots, 125_{4,8}$ are arranged as a rectangular array of four (4) rows 115-1, ..., 115-4 and eight (8) columns 120-1, ..., 120-8. Each of the locations $125_{1,1}, \ldots, 125_{4,8}$ comprises multiple surface contacts 130-1, 130-2 for connecting to conductors of a respective multi-conductor cable, e.g., a twinaxial (or "twinax") cable. In some embodiments, the conductors of the multi-conductor cable provide differential signaling with the surface contacts 130-1, 130-2.

Alternate implementations of the array may include other numbers and/or arrangements of the locations $125_{1,1}, \ldots, 125_{4,8}$. For example, the locations $125_{1,1}, \ldots, 125_{4,8}$ may be arranged in staggered rows and/or columns, in radial patterns, and other regular or irregular patterns. Alternate implementations of the array may include other numbers and/or arrangements of the surface contacts 130-1, 130-2 within the respective locations $125_{1,1}, \ldots, 125_{4,8}$. For example, each of the locations $125_{1,1}, \ldots, 125_{4,8}$ may include an additional surface contact that connects with a ground conductor of the multi-conductor cable.

As will be discussed in greater detail below, the configuration of the multi-conductor cables in the electrical connector enables a greater number and/or a greater density of the surface contacts 130-1, 130-2. In one non-limiting example, the surface contacts 130-1, 130-2 have a height of about 1 mm (e.g., along a direction of the corresponding column 120-1, ..., 120-8) and a width of about 0.5 mm (e.g., along a direction of the corresponding row 115-1, ..., 115-4). Within a particular row 115-1, ..., 115-4, the surface contacts 130-1, 130-2 at a particular location $125_{1,1}, \ldots, 125_{4,8}$ have a pitch of about 0.6 mm, and the locations $125_{1,1}, \ldots, 125_{4,8}$ have a pitch of about 1.8 mm. Within a particular column 120-1, ..., 120-8, the locations $125_{1,1}, \ldots, 125_{4,8}$ have a pitch of about 2.75 mm. Different dimensions of the surface contacts 130-1, 130-2 and/or different pitches are also contemplated.

Figure 2:
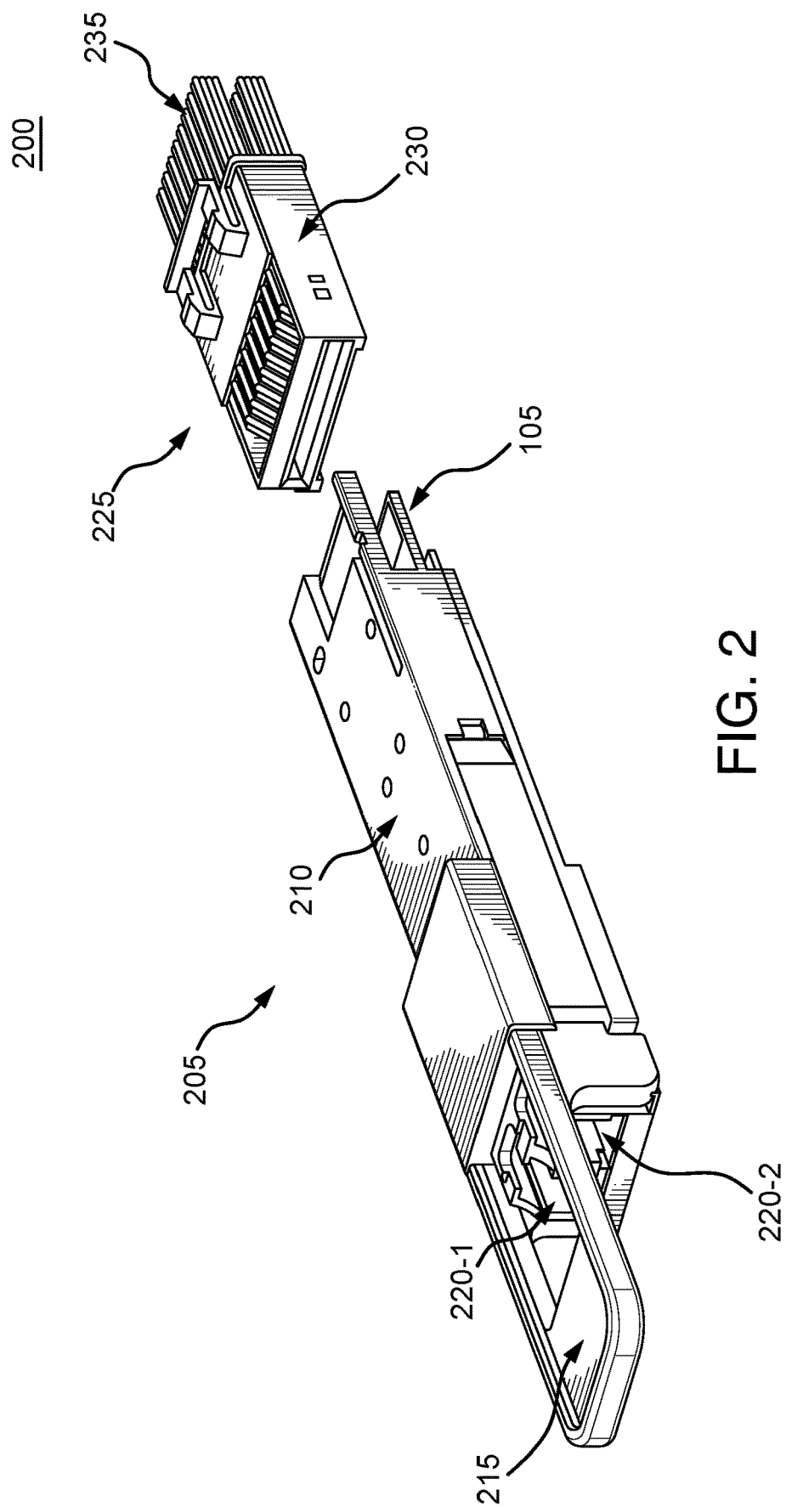
FIG. 2 illustrates an unconnected configuration of a pluggable optical module and an edge connector, according to one or more embodiments.

In diagram 200 of FIG. 2, a pluggable optical module 205 and an edge connector 225 are illustrated in an unconnected configuration. The pluggable optical module 205 comprises a body 210 that encloses one or more electrical components and/or optical components that collectively perform any suitable functions. In some embodiments, the pluggable optical module 205 operates as a transceiver module. In some embodiments, one or more external surfaces of the body 210 slidingly engage with one or more internal surfaces of a network device to align the pluggable optical module 205 while being plugged into the network device. The PCB 105 is coupled with the electrical component(s) and/or the optical component(s) and extends from the body 210, such that the surface contacts on the first surface 110 are exposed and are able to be received into the edge connector 225.

The PCB 105 extends from a first end of the body 210 (e.g., an inserted end of the pluggable optical module 205), and a handle 215 extends from an opposing second end of the body 210. The handle 215 may be manipulated by a user to insert and/or remove the pluggable optical module 205 in the network device. Two (2) external ports 220-1, 220-2 are arranged at the second end of the body 210 and provide an external connectivity with the electrical component(s) and/or the optical component(s). Other numbers and/or configurations of the external ports 220-1, 220-2 are also contemplated.

The edge connector 225 comprises a connector body 230 that defines an interior volume into which the PCB 105 may be received. The connector body 230 is further configured to receive a plurality of multi-conductor cables 235 that extend from an external surface of the connector body 230 into the interior volume. Each of the multi-conductor cables 235 may include two conductors (e.g., a twinax cable) or more. As shown, the PCB 105 is received into a first end of the connector body 230, and the multi-conductor cables 235 are received into an opposing second end of the connector body 230.

Figure 3A:
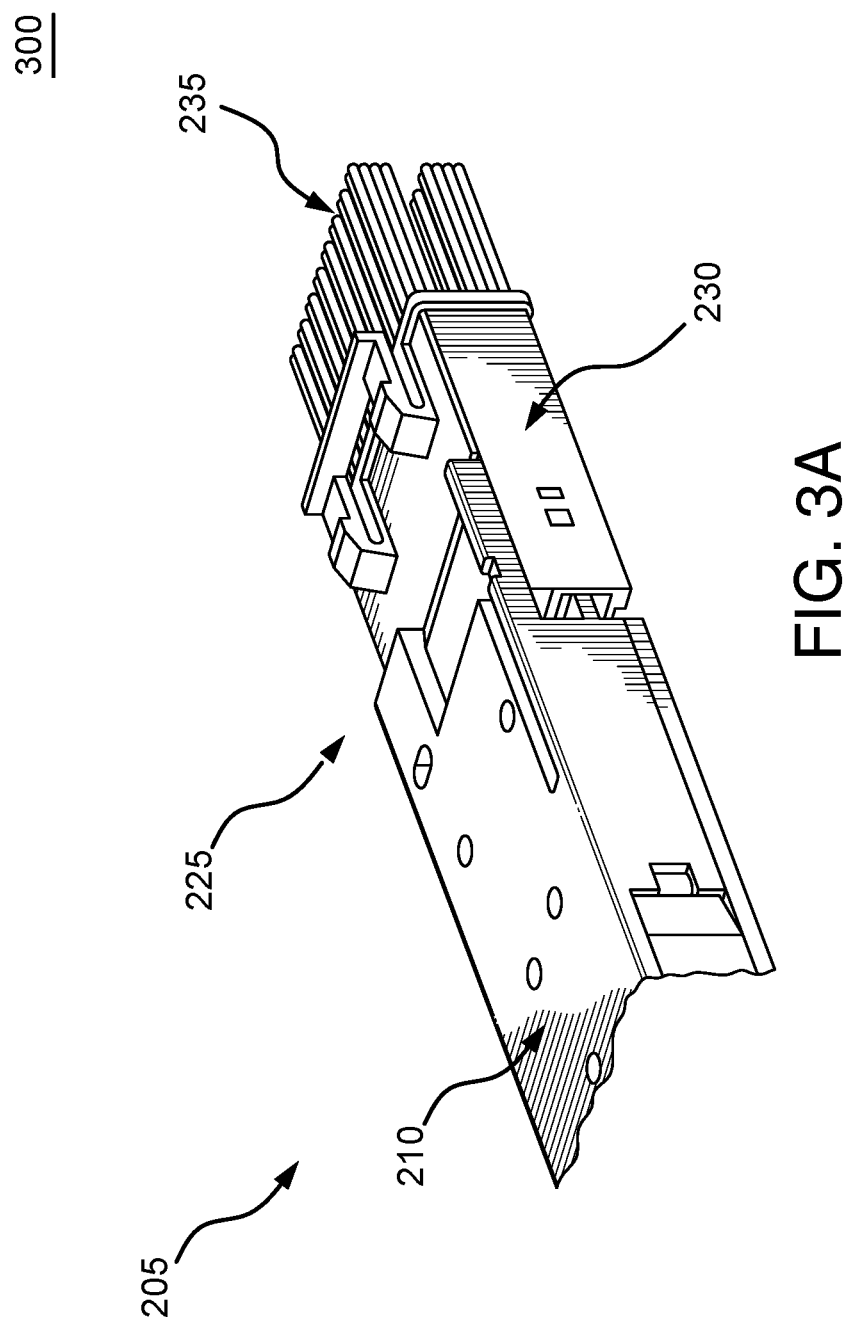
FIG. 3A is a perspective view.
Figure 3B:
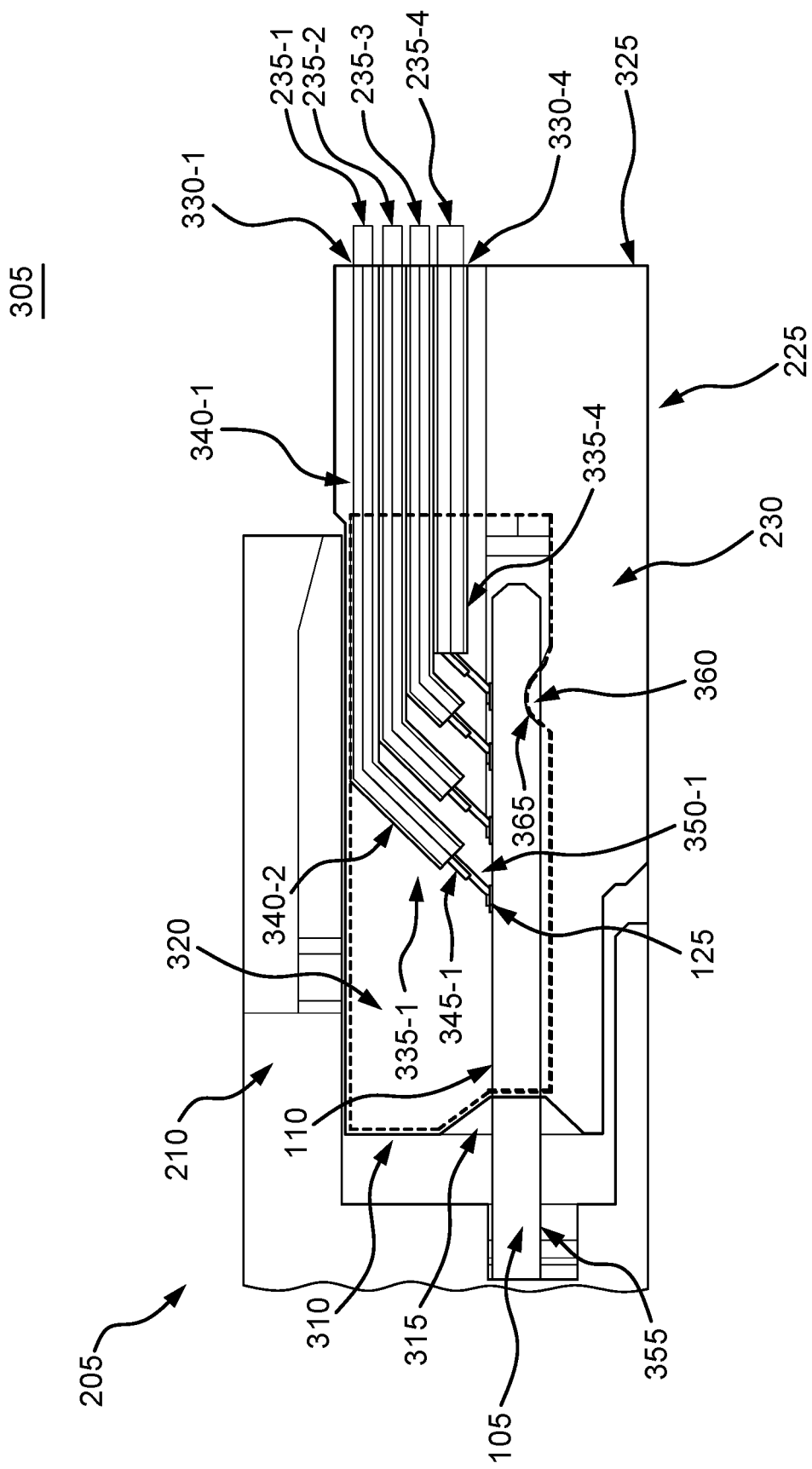
FIG. 3B is a cross-section view, of a connected configuration of a pluggable optical module and an edge connector, according to one or more embodiments.

Diagram 300 of FIG. 3A provides a perspective view, and diagram 305 of FIG. 3B provides a cross-section view, of the pluggable optical module 205 and the edge connector 225 in a connected configuration. The connector body 230 is contoured to define an interior volume 320. The connector body 230 comprises a first surface 310 having an opening 315 through which the PCB 105 is received into the interior volume 320. In some embodiments, the first surface 310 is tapered to the opening 315 to accommodate receiving the PCB 105.

The PCB 105 is received to a connection position in the interior volume 320. At a second surface 355 (e.g., a bottom surface) of the PCB 105 opposite the first surface 110, a groove 365 receives a ridge 360 of the connector body 230 to retain the PCB 105 in the connection position.

Multi-conductor cables 235-1, 235-2, . . . , 235-4 are received into the connector body 230 through respective cable openings 330-1, . . . , 330-4 at an external surface 325 of the connector body 230. As shown, the external surface 325 is at an end of the connector body 230 opposite the first surface 310.

The connector body 230 comprises a plurality of passageways 335-1, . . . , 335-4 extending from the external surface 325 to the interior volume 320. Each multi-conductor cable 235-1, 235-2, . . . , 235-4 is received in a respective passageway 335-1, . . . , 335-4. As shown, the connector body 230 comprises a plurality of tubular members and the passageways 335-1, . . . , 335-4 are defined as openings of the tubular members. In alternate embodiments, the passageways 335-1, . . . , 335-4 are defined as openings formed through a monolithic structure of the connector body 230. The openings through the tubular members or the monolithic structure may have an inner diameter (or contour) that is matched to an outer diameter (or contour) of the multi-conductor cables 235-1, 235-2, . . . , 235-4. In other alternate embodiments, the passageways 335-1, . . . , 335-4 are defined through a grid structure of the connector body 230. The openings of the grid structure may match, but need not be matched, to the multi-conductor cables 235-1, 235-2, . . . , 235-4. In this way, the plurality of passageways 335-1, . . . , 335-4 retain the multi-connector cables 235-1, 235-2, . . . , 235-4 to limit or prevent movement of the multi-connector cables 235-1, 235-2, . . . , 235-4 when connected to the array of surface contacts 130-1, 130-2.

In some embodiments, each of the passageways 335-1, . . . , 335-4 comprises a respective first section 340-1 extending into the interior volume 320 from the respective cable opening 330-1, . . . , 330-4, and a respective second section 340-2 extending from the respective first section 340-1 toward a first plane of the surface contacts 130-1, 130-2 (e.g., a plane of the first surface 110) when the array of surface contacts 130-1, 130-2 is received into the connection position.

Figure 4:
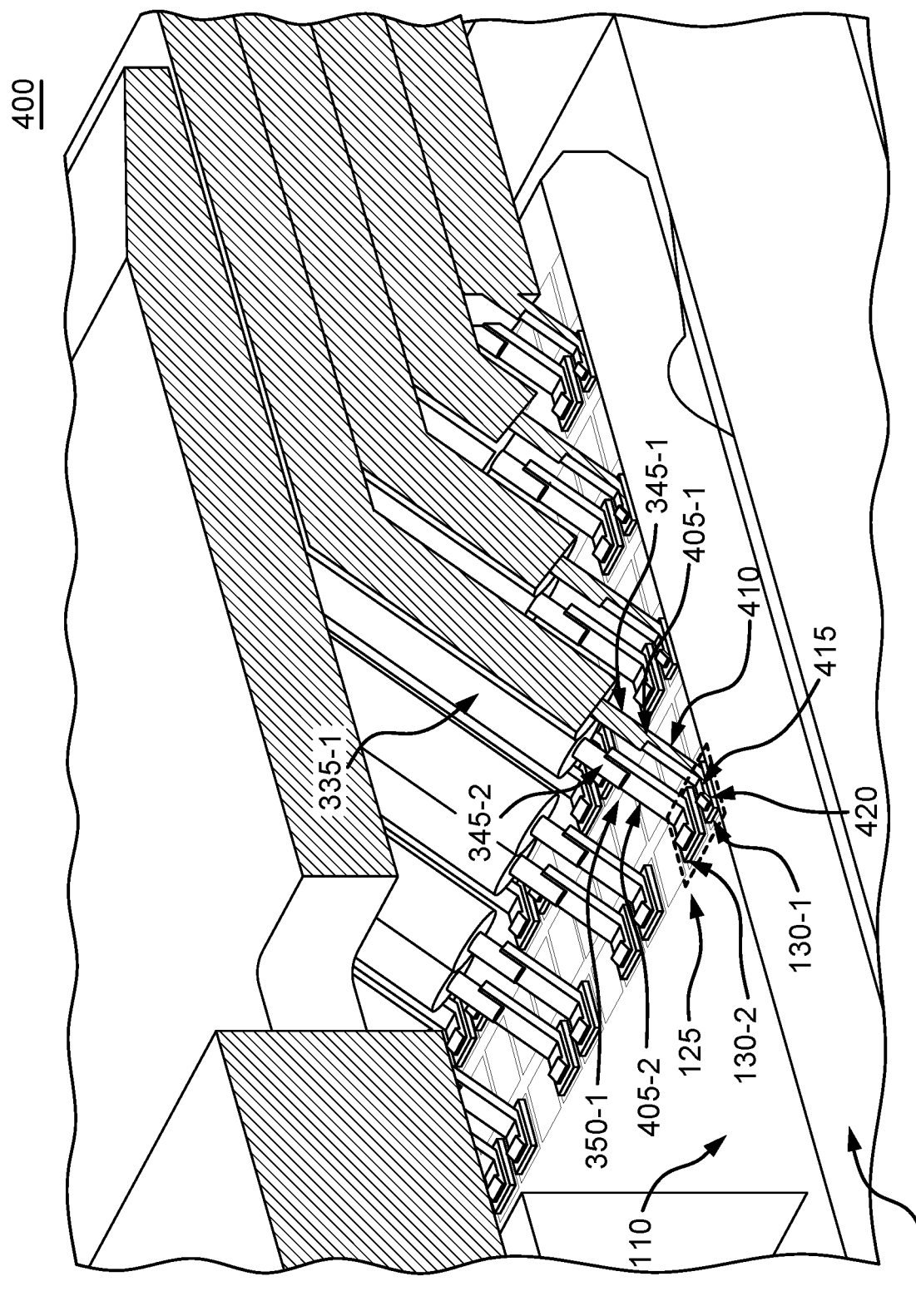
FIG. 4 illustrates connection of cable terminators with an array of surface contacts in a connection position, according to one or more embodiments.

The edge connector 225 further comprises a plurality of cable terminators 350-1 that are each configured to couple with a respective multi-conductor cable 235-1, . . . , 235-4 exiting the second section 340-2 of a respective passageway 335-1, . . . , 335-4. As shown in greater detail in diagram 400 of FIG. 4, each cable terminator 350-1 comprises a plurality of pins 405-1, 405-2 that couple with a respective conductor 345-1, 345-2 of the multi-conductor cable and that extend to a respective contact surface 420. The contact surfaces 420 of the plurality of cable terminators 350-1 extend to a second plane. The first plane and the second plane are coplanar when the array of the surface contacts 130-1, 130-2 is in the connection position, such that the cable terminators 350-1 contact the array of the surface contacts 130-1, 130-2.

In some embodiments, the first sections 340-1 of the passageways 335-1, . . . 335-4 and the second sections 340-2 of the passageways 335-1, . . . , 335-4 are straight sections. In some embodiments, the first sections 340-1 are parallel to the plane of the first surface 110. In other embodiments, the first sections 340-1 and/or the second sections 340-2 may be curved sections. In some embodiments, the first sections 340-1 of the passageways 335-1, . . . , 335-4 are parallel with each other. In some embodiments, the second sections 340-2 of the passageways 335-1, . . . , 335-4 are parallel with each other. The dimensioning of the first sections 340-1 and the second sections 340-2, as well as the relative angle(s) between the first sections 340-1 and the second sections 340-2, may be selected to provide a pitch of the contact surfaces 420 to correspond to the pitch of the surface contacts 130-1, 130-2. Further, in some embodiments, one or more of the passageways 335-1, . . . , 335-4 may omit the second sections 340-2 to provide the desired pitch of the contact surface 420. Further, the arrangement of the contact surfaces 420 may be selected to permit the edge connector 225 to connect with legacy implementations of the pluggable optical module 205 (e.g., including a single row of the surface contacts 130-1, 130-2).

Within the edge connector 225, the first sections 340-1 and second sections 340-2 of the passageways provide a "flyover" configuration of the multi-conductor cables 235-1, . . . , 235-4, which generally permits the multi-conductor cables 235-1, . . . , 235-4 to be spaced further apart from the surface contacts 130-1, 130-2 and any other components at or near the first surface 110.

In some embodiments, for each cable terminator 350-1, each pin 405-1, 405-2 comprises a leg 410 and a foot 415 extending from the leg 410. In some embodiments, the foot 415 defines the contact surface 420 in the second plane. In some embodiments, the leg 410 of the cable terminators 350-1 extends parallel to an axis of the second section 340-2 of the respective passageway 335-1, . . . , 335-4. In some embodiments, the foot 415 extends parallel to the plane of the first surface 110. In certain embodiments, the leg 410 extends at a non-normal angle to the plane of the contact surface 420 such that the leg 410 does not extend parallel with the normal of the plane of the contact surface 420. For example, the leg 410 may extend at a 30° angle, 45° angle, 60° angle, or any angle less than 90° from the plane of the contact surface 420.

In some embodiments, a compressive force is applied between the plurality of cable terminators 350-1 and the array of surface contacts 130-1, 130-2 when the array is in the connection position. For example, the pins 405-1, 405-2 may be land-grid array (LGA) pins and the mechanical tolerances of the edge connector 225 may be selected so that the array of surface contacts 130-1, 130-2 can slide beneath the pins 405-1, 405-2. In another example, the edge connector 225 may include a feature that displaces the first surface 110 (e.g., the PCB 105) toward the second plane of the plurality of cable terminators 350-1 as the PCB 105 approaches the connection position in the interior volume 320.

In another example, the edge connector 225 may include springs or other biasing members that apply a force to the respective multi-conductor cables 235-1, . . . , 235-4 toward the first plane of the surface contacts 130-1, 130-2. As shown in diagrams 500, 515 of FIG. 5, the PCB 105 of the pluggable optical module 205 comprises an array of surface contacts 505 on the first surface 110 (e.g., upper surface). The PCB 105 further defines a plurality of lateral notches 510-1, . . . , 510-4 that each extend down from the first surface 110. As shown, the lateral notches 510-1, . . . , 510-4 extend fully through the PCB 105; however, in other implementations the lateral notches 510-1, . . . , 510-4 extend partly through the PCB 105 (e.g., the PCB 105 has a reduced thickness at the lateral notches 510-1, . . . , 510-4).

In the diagram 515, the edge connector 225 includes a monolithic member 520 that is deformable or pivotable within the interior volume 320. The plurality of passageways 335-1, . . . , 335-4 extend through the monolithic member 520, and the cable terminators 350-1 extend to a bottom surface 525 of the monolithic member 520. The monolithic member 520 includes one or more ridges 535 at the bottom surface 525. One or more springs 530 contact another surface of the edge connector 225 and bias the monolithic member 520 in a downward direction. As the PCB 105 is received into the interior volume 320, the one or more ridges 535 slide along the first surface 110 of the PCB 105. The one or more ridges 535 are received by one or more second features of the PCB 105 (e.g., the lateral notches 510-1, . . . , 510-4) at the connection position, which lowers the plane of the cable terminators 350-1 to be coplanar with the plane of the array of the surface contacts 505.

In some embodiments, and as shown in diagram 600 of FIG. 6, the PCB 105 further comprises a second array of surface contacts 130-3 disposed on the second surface 355 (e.g., a bottom surface) opposite the first surface 110, and the connector body 230 further comprises a second plurality of passageways 335-5, . . . , 335-8 extending into the interior volume 320 from a second plurality of cable openings (e.g., at the external surface 325). In such cases, the edge connector 225 further comprises a second plurality of cable terminators 350-5, . . . , 350-8 each configured to couple with a respective multi-conductor cable 235-5, . . . , 235-8 exiting a respective passageway of the second plurality of passageways 335-5, . . . , 335-8. A third plane of the second array of surface contacts (e.g., the second surface 355) is coplanar with a fourth plane of the contact surfaces of the second plurality of cable terminators 350-5, . . . , 350-8 when the second array is received into the connection position. In some embodiments, a compressive force is applied between the second plurality of cable terminators 350-5, . . . , 350-8 and the second array of surface contacts 130-3, e.g., as the PCB 105 approaches the connection position.

Figure 7:
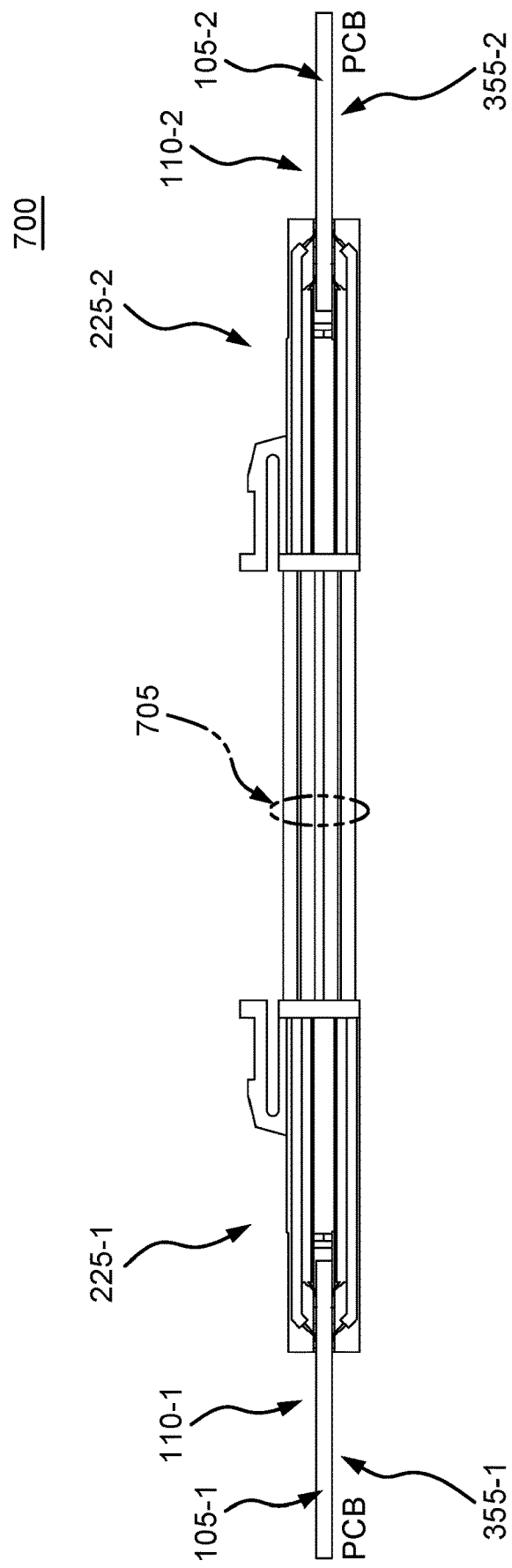
FIG. 7 illustrates connection between printed circuit boards, according to one or more embodiments.

FIG. 7 is a diagram 700 illustrating connection between PCBs 105-1, 105-2. The features in the diagram 700 may be used in conjunction with other embodiments. A first edge connector 225-1 includes a first plurality of cable terminators coupled to surface contacts of a first surface 110-1 and to surface contacts of a second surface 355-1 of a first PCB 105-1, and a second edge connector 225-2 includes a second plurality of cable terminators coupled to surface contacts of a first surface 110-2 and to surface contacts of a second surface 355-2 of a second PCB 105-2. A plurality of multi-conductor cables 705 are connected between the first plurality of cable terminators of the first edge connector 225-1 and the second plurality of cable terminators of second edge connector 225-2.

In some embodiments, the arrangement illustrated in the diagram 700 may be implemented as a cabled backplane of a network device. In some embodiments, the arrangement illustrated in the diagram 700 may be implemented to connect a motherboard and a daughterboard of a network device. Other implementations using multiple edge connectors 225-1, 225-2 are also contemplated.

Figure 8:
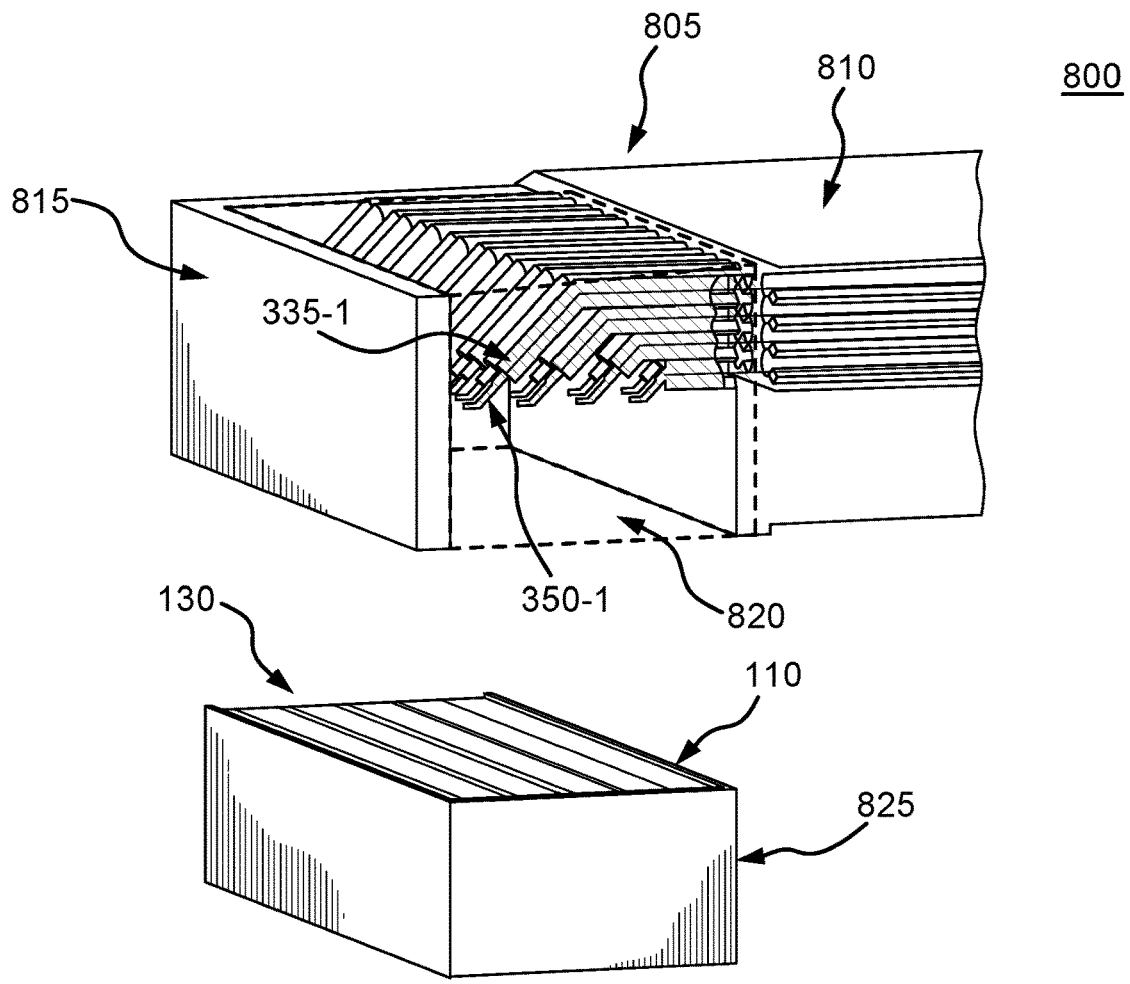
FIG. 8 illustrates an unconnected configuration of an array of surface contacts disposed on a base and a cap connector, according to one or more embodiments.
Figure 9:
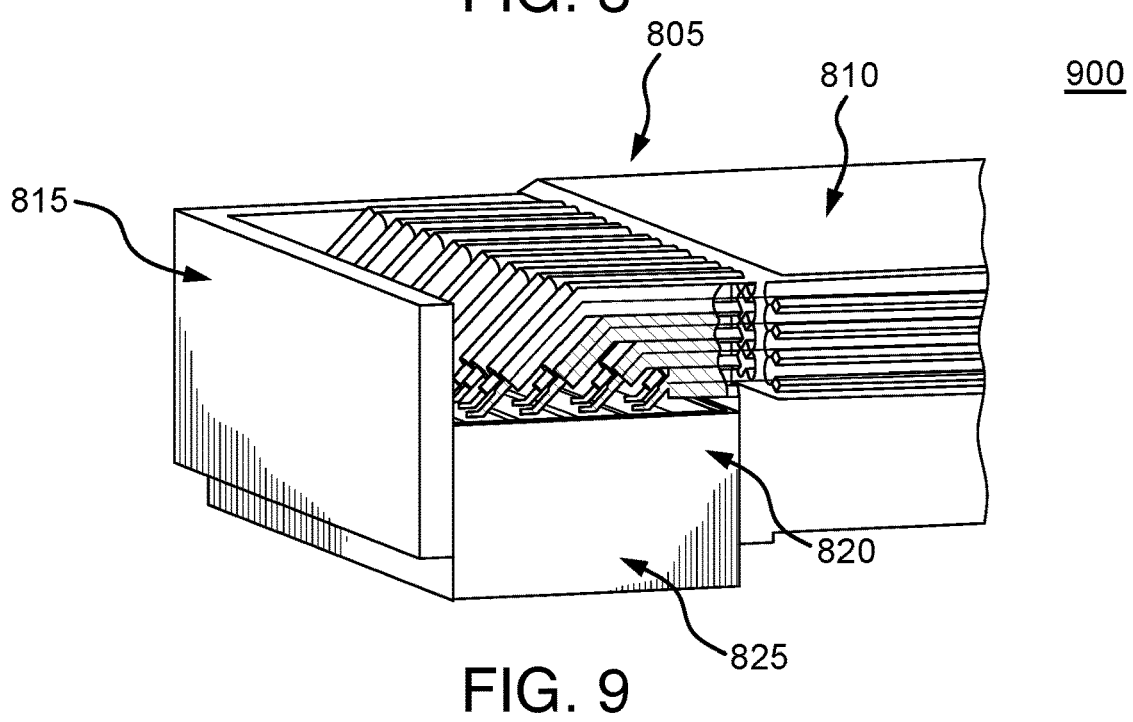
FIG. 9 illustrates a connected configuration of an array of surface contacts disposed on a base and a cap connector, according to one or more embodiments.

Diagram 800 of FIG. 8 illustrates an unconnected configuration, and diagram 900 of FIG. 9 illustrates a connected configuration, of an array of surface contacts 130 disposed on a base 825 and a cap connector 805. The cap connector 805 comprises a connector body 810 defining a plurality of passageways 335-1 that receive multi-conductor cables 235-1, 235-2, . . . , 235-4. The connector body 810 further comprises a plurality of walls 815 that define an interior volume 820 of the cap connector 805. The plurality of passageways 335-1 and the cable terminators 350-1 extend into the interior volume 820.

The base 825 may have any suitable implementation providing suitable height for the cap connector 805 to be seated on the base 825 and connect to the array of surface contacts 130. In some embodiments, the base 825 comprises an integrated circuit. In other embodiments, the base 825 comprises a platform or other structure that raises the first surface 110. In some embodiments, the walls 815 may provide one or more contacting surfaces that align the cap connector 805 with the base 825. In some embodiments, the walls 815 and/or base 825 may include guide features that align the cap connector 805 with the base 825.

In certain embodiments, the pluggable module receives electric power wirelessly. For example, a transmission circuit may be included on or in the electric coupler, the cage, or a heatsink. A receiving circuit may be included on or in the pluggable module. When the pluggable module is inserted or positioned in the cage, a coil in the transmission circuit delivers electric power by inducing an electric current in a coil of the receiving circuit. In this manner, the pluggable module receives electric power that is used to power the other components and features of the pluggable module.

Figure 10:
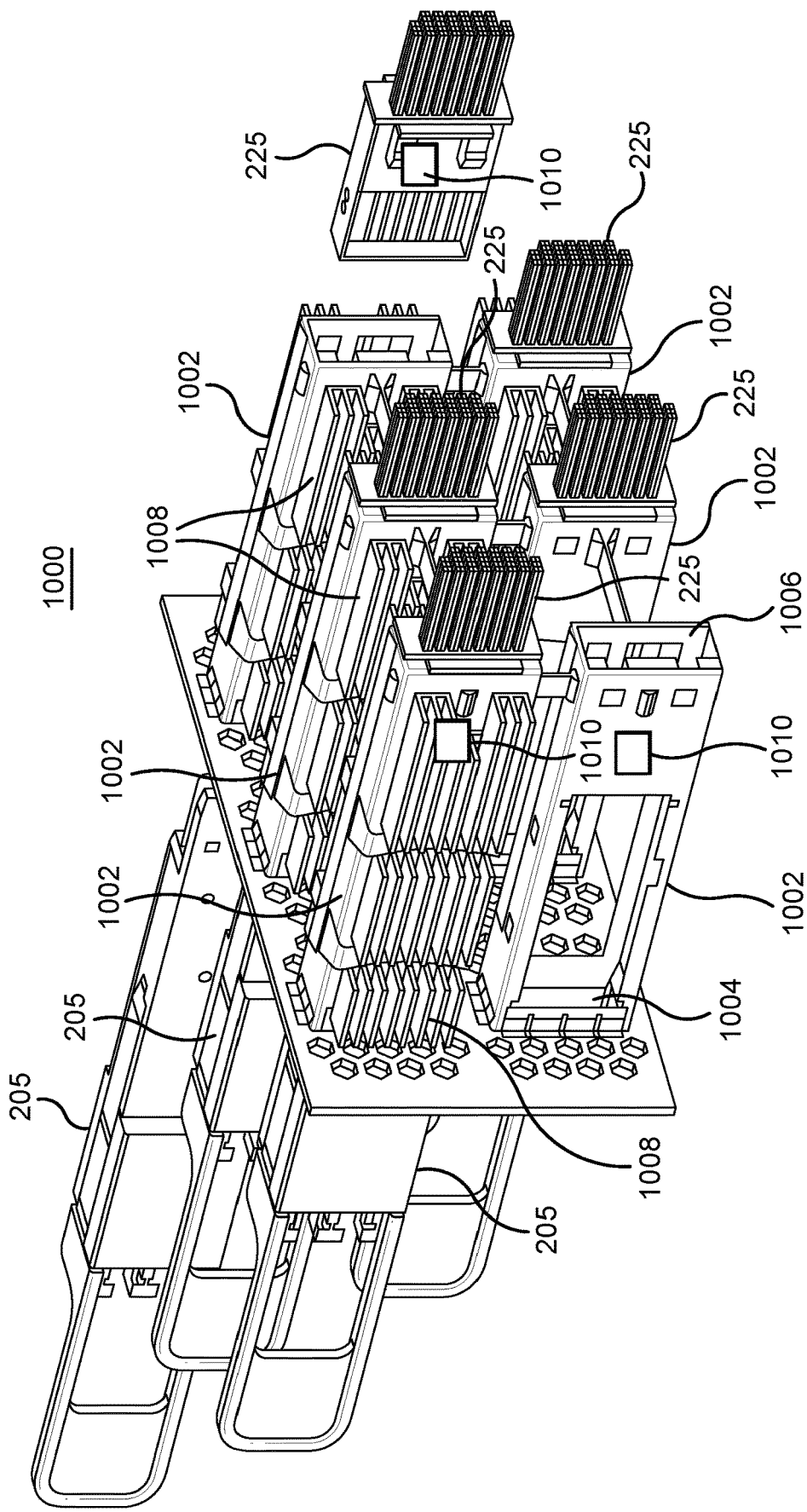
FIG. 10 illustrates an example system.

FIG. 10 illustrates an example system 1000. As seen in FIG. 10, the system 1000 includes cages 1002 that are arranged to receive pluggable modules 205 and electrical connectors. Additionally, heatsinks 1008 may be positioned on the cages 1002. Transmission circuits 1010 may be positioned on the cages 1002, the electrical connectors, and/or the heatsinks 1008. In certain embodiments, the transmission circuits 1010 deliver electric power wirelessly to the pluggable modules 205 when the pluggable modules 205 are positioned in the cages 1002.

Each cage 1002 may be shaped to receive and physically support a pluggable module 205 and an electrical connector. As seen in FIG. 10, each cage 1002 includes a first end 1004 and a second end 1006. The first end 1004 and the second end 1006 are positioned at opposite ends of the cage 1002. The first end 1004 is shaped to receive a pluggable module 205, and the second end is shaped to receive an electrical connector. In the example of FIG. 10, the electrical connector includes the edge connector 225, but in some embodiments, the electrical connector may include the cap connector 805. Additionally, the cage 1002 may include tabs or other cavities that hold the pluggable module 205 and the electrical connector in place when the pluggable module 205 and the electrical connector are properly inserted into the cage 1002. The pluggable module 205 and the electrical connector may also physically and electrically connect to each other when the pluggable module 205 and the electrical connector are properly inserted into the cage.

Each cage 1002 may have a heatsink 1008 positioned on an exterior surface of the cage 1002. The heatsink 1008 may absorb and remove heat generated by the pluggable module 205 during operation. For example, the heatsink 1008 may include metallic blades or fins that absorb heat from the pluggable module 205 when the pluggable module 205 is inserted in the cage 1002. Circulating air over the blades or fins carries the heat away from the cage 1002 and the system 1000.

The system 1000 includes transmission circuits 1010 that deliver electric power wirelessly to the pluggable modules 205. The transmission circuits 1010 may be positioned on or in any suitable component in the system 100. For example, the transmission circuits 1010 may be positioned on or in the cages 1002, the electrical connectors (e.g., the edge connectors 225), or the heatsinks 1008. A transmission circuit 1010 may receive electrical power from a power source and use a coil to induce an electric current in another coil in a receiving circuit on or in the pluggable module 205. The induced current may then be used to power the pluggable module 205. In this manner, the transmission circuit 1010 delivers electric power wirelessly to the pluggable module 205 when the pluggable module 205 is positioned in the cage 1002.

Figure 11:
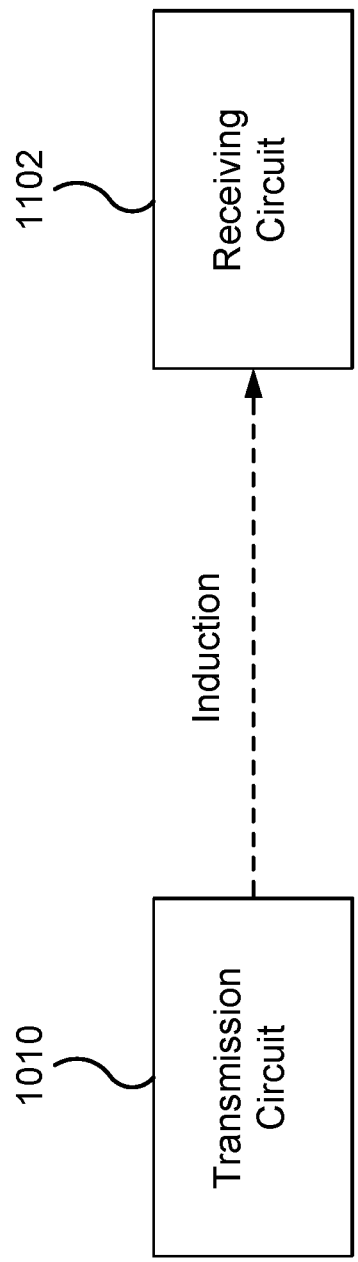
FIG. 11 illustrates an example transmission circuit and receiving circuit in the system of FIG. 10.

FIG. 11 illustrates an example transmission circuit 1010 and receiving circuit 1102. As discussed previously, the transmission circuit 1010 may be positioned on or in a cage, an electrical connector, or a heatsink on the cage. The receiving circuit 1102 may be positioned on or in a pluggable module. The transmission circuit 1010 receives electric power from a power source and delivers electric power wirelessly to the receiving circuit 1102 by inducing an electric current in the receiving circuit 1102. The receiving circuit 1102 then uses that electric current to power the pluggable module.

Figure 12:
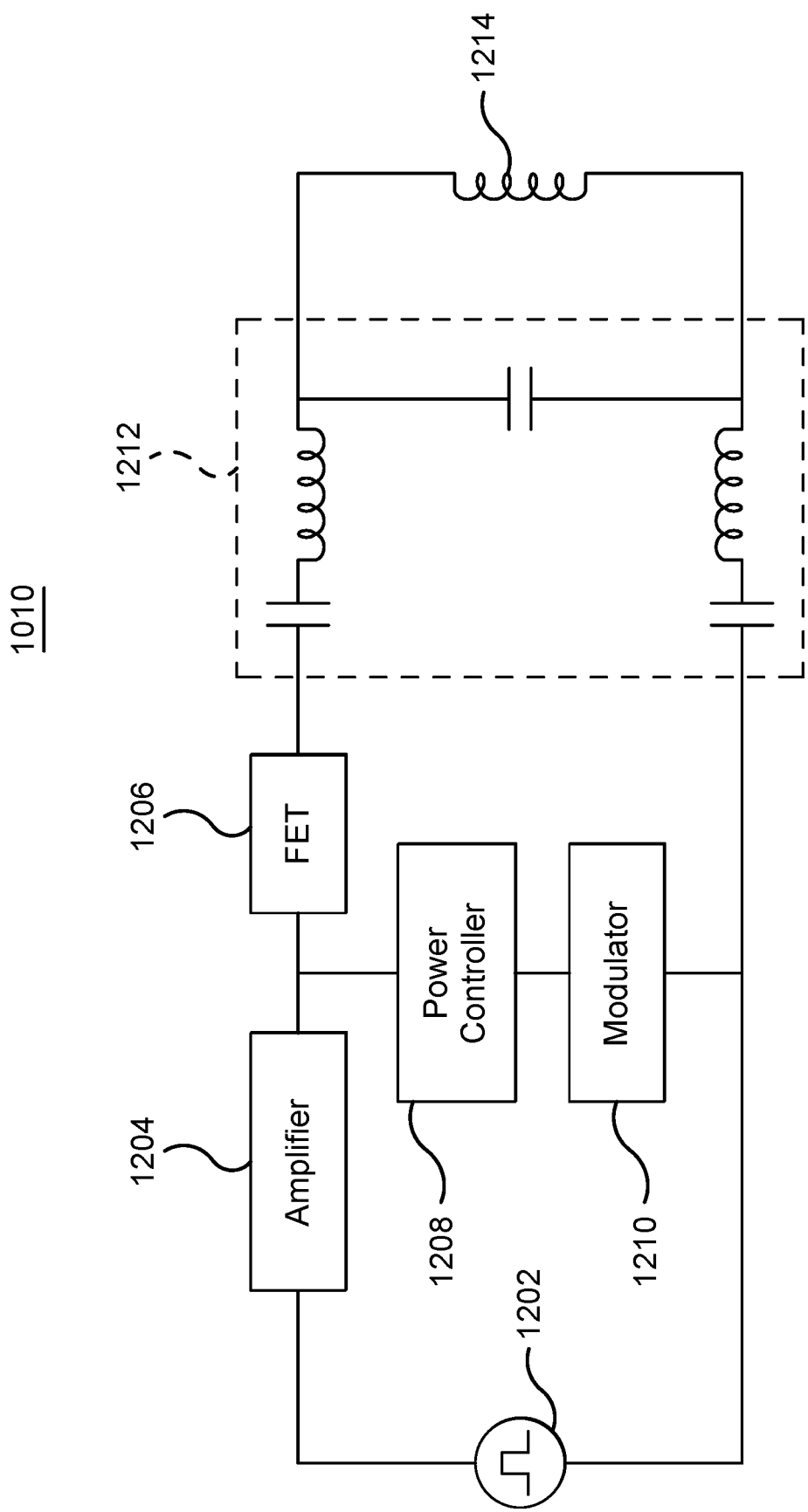
FIG. 12 illustrates an example transmission circuit in the system of FIG. 10.

FIG. 12 illustrates an example transmission circuit 1010. As seen in FIG. 12, the transmission circuit 1010 is connected to a power source 1202 and includes an amplifier circuit 1204, a field effect transistor (FET) circuit 1206, a power controller 1208, a modulator 1210, a tuning circuit 1212, and a coil 1214. Generally, the components of the transmission circuit 1010 operate to produce and adjust an electric current flowing through the coil 1214. This current induces another current in a receiving circuit.

The power source 1202 may be electrically connected to and disconnected from the components of the transmission circuit 1010. The power source 1202 supplies electric power to the transmission circuit 1010. The amplifier circuit 1204, FET circuit 1206, power controller 1208, modulator 1210, and tuning circuit 1212 may adjust and modulate the signals from the power source 1202 to adjust the current in the coil 1214. In some embodiments, the power controller 1208 may adjust an amount of power provided by the power source 1202 or the power controller 1208 may select a power source 1202 to connect to the other components of the transmission circuit 1010. For example, the power controller 1208 may adjust a voltage or frequency of the power source 1202. As another example, the power controller 1208 may close or open certain switches that cause different power sources 1202 that provide different amounts of power to be connected or disconnected from the transmission circuit 1010. There may be power sources 1202 that provide 3.3V, 5V, and 12V, and the power controller 1208 may connect or disconnect one or more of these power sources 1202 from the transmission circuit 1010 to adjust an amount of electric power provided to the transmission circuit 1010.

The power controller 1208 may include any suitable circuitry that controls the operation of the transmission circuit 1010. For example, the power controller may include a processor and memory that execute software instructions to control the operation of the transmission circuit 1010.

The processor is any electronic circuitry, including, but not limited to one or a combination of microprocessors, microcontrollers, application specific integrated circuits (ASIC), application specific instruction set processor (ASIP), and/or state machines, that communicatively couples to the memory and controls the operation of the power controller 1208. The processor may be 8-bit, 16-bit, 32-bit, 64-bit or of any other suitable architecture. The processor may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components. The processor controls the operation and administration of the power controller 1208 by processing information (e.g., information received from the power source 1202 or other components of the transmission circuit 1010). The processor is not limited to a single processing device and may encompass multiple processing devices.

The memory may store, either permanently or temporarily, data, operational software, or other information for the processor. The memory may include any one or a combination of volatile or non-volatile local or remote devices suitable for storing information. For example, the memory may include random access memory (RAM), read only memory (ROM), magnetic storage devices, optical storage devices, or any other suitable information storage device or a combination of these devices. The software represents any suitable set of instructions, logic, or code embodied in a computer-readable storage medium. For example, the software may be embodied in the memory, a disk, a CD, or a flash drive. In particular embodiments, the software may include an application executable by the processor to perform one or more of the functions described herein.

The power controller 1208 may adjust any aspect of the transmission circuit 1010. For example, the power controller 1208 may adjust a voltage or frequency of the power source 1202. As another example, the power controller 1208 may adjust which of several different power sources 1202 are connected or disconnected from the transmission circuit 1010. The power controller 1208 may also adjust an amount of modulation provided by the modulator 1210 to the signals from the power source 1202. The power controller 1208 may also turn on or off the FET circuit 1206.

The tuning circuit 1212 may provide impedance tuning to further adjust the current in the coil 1214. For example, the tuning circuit 1212 may increase or decrease the magnitude or direction of the current in the coil 1214. As a result, the amount of current induced by the coil 1214 is adjusted.

Figure 13:
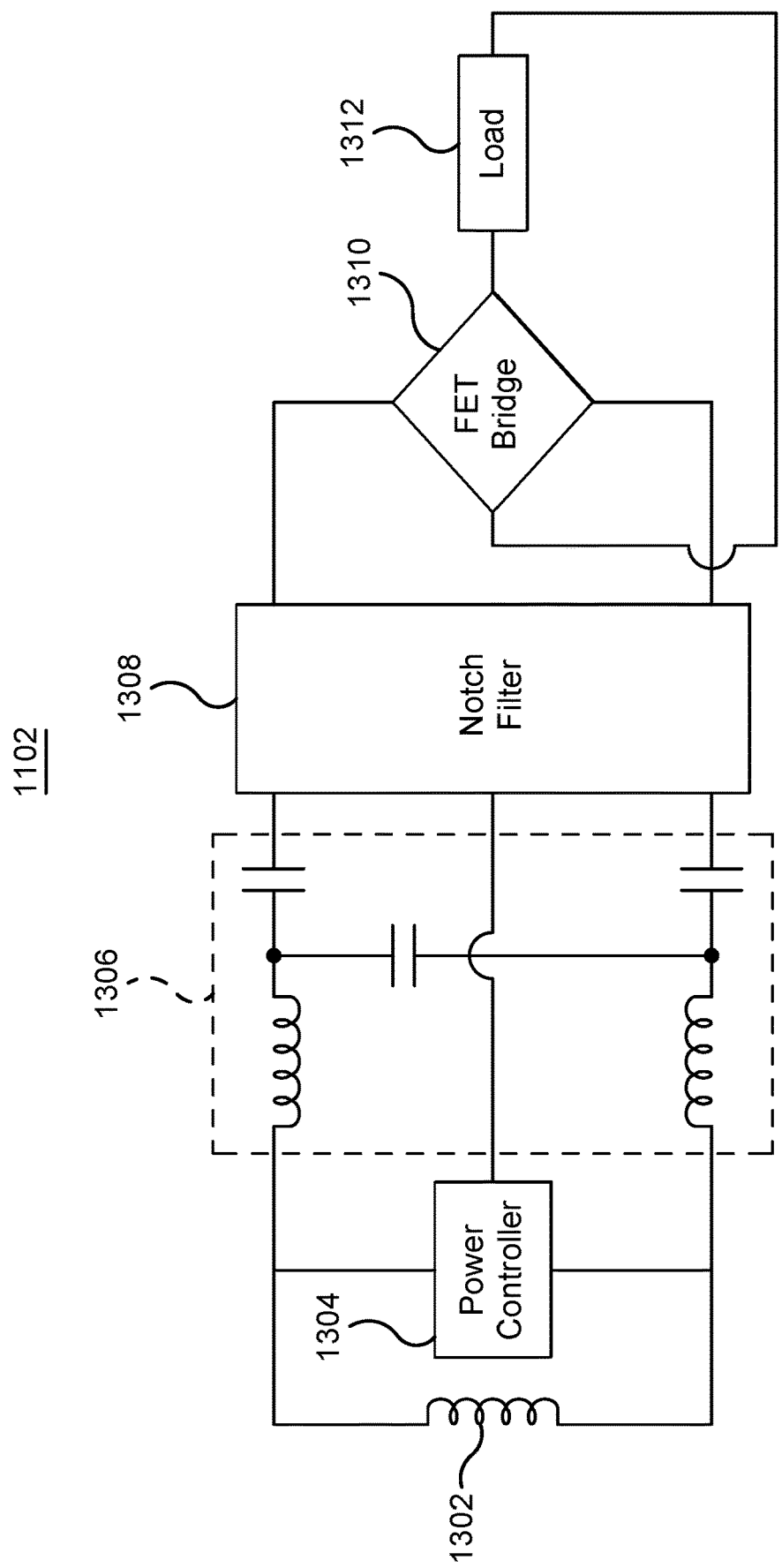
FIG. 13 illustrates an example receiving circuit in the system of FIG. 10.

FIG. 13 illustrates an example receiving circuit 1102. As seen in FIG. 13, the receiving circuit 1102 includes a coil 1302, a power controller 1304, a tuning circuit 1306, and a notch filter 1308. A transmission circuit may induce an electric current in the coil 1302 to deliver electric power wirelessly to the receiving circuit 1102. The components of the receiving circuit 1102 then provide electric power to the FET bridge 1310 and the load 1312.

When the coil 1302 is positioned near a transmission circuit, a coil in the transmission circuit induces an electric current in the coil 1302. In some embodiments, when a pluggable module that includes the receiving circuit 1102 is positioned in a cage, the receiving circuit 1102 is positioned near the transmission circuit. The transmission circuit then induces an electric current in the coil 1302, which powers the receiving circuit 1102 and the pluggable module.

The power controller 1304 may control or adjust other components of the receiving circuit 1102, such as the notch filter 1308. For example, the power controller 1304 may detect an amount of power from the coil 1302 and adjust the notch filter 1308 so that the notch filter 1308 provides a desired voltage to the FET bridge 1310 and the load 1312. The power controller 1304 may include a processor and memory that execute software instructions to control the operation of the receiving circuit 1102.

The processor is any electronic circuitry, including, but not limited to one or a combination of microprocessors, microcontrollers, application specific integrated circuits (ASIC), application specific instruction set processor (ASIP), and/or state machines, that communicatively couples to the memory and controls the operation of the power controller 1304. The processor may be 8-bit, 16-bit, 32-bit, 64-bit or of any other suitable architecture. The processor may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components. The processor controls the operation and administration of the power controller 1304 by processing information (e.g., information received from the coil 1302 or other components of the receiving circuit 1102). The processor is not limited to a single processing device and may encompass multiple processing devices.

The memory may store, either permanently or temporarily, data, operational software, or other information for the processor. The memory may include any one or a combination of volatile or non-volatile local or remote devices suitable for storing information. For example, the memory may include random access memory (RAM), read only memory (ROM), magnetic storage devices, optical storage devices, or any other suitable information storage device or a combination of these devices. The software represents any suitable set of instructions, logic, or code embodied in a computer-readable storage medium. For example, the software may be embodied in the memory, a disk, a CD, or a flash drive. In particular embodiments, the software may include an application executable by the processor to perform one or more of the functions described herein.

The tuning circuit 1306 provides impedance tuning, and the notch filter 1308 filters or removes signals with particular frequencies. As a result, the tuning circuit 1306 and the notch filter 1308 provide a signal with a particular or desired voltage to the FET bridge 1310 and the load 1312. This signal is then used to power the FET bridge 1310 and the load 1312. The load 1312 may include other components of the pluggable module that perform the functions of the pluggable module. In this manner, the receiving circuit 1102 powers the pluggable module.

Figure 14:
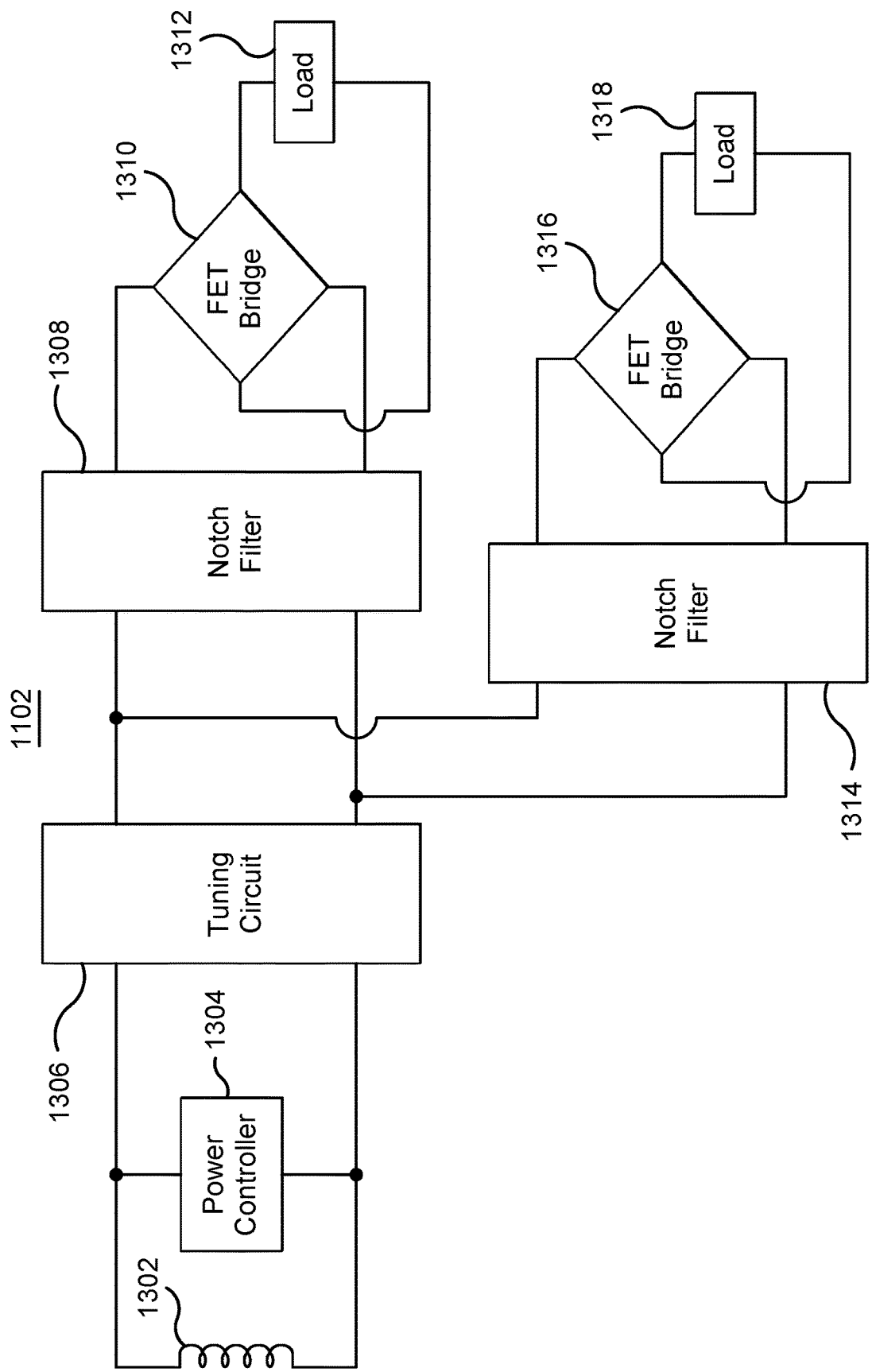
FIG. 14 illustrates an example receiving circuit in the system of FIG. 10.

In some embodiments, the receiving circuit 1102 powers multiple rails. FIG. 14 illustrates an example receiving circuit 1102. In the example of FIG. 14, the receiving circuit 1102 powers two different rails. Specifically, the receiving circuit includes the coil 1302, the tuning circuit 1306, and the notch filter 1308 that power the FET bridge 1310 and the load 1312. The receiving circuit 1102 also includes a notch filter 1314 that may be separately controlled by the power controller 1304 to use the signal from the tuning circuit 1306 to provide a signal with a particular or desired voltage to a separate FET bridge 1316 and load 1318. In this manner, the receiving circuit 1102 may be expanded to power any suitable number of rails that use different amounts of power.

Figure 15:
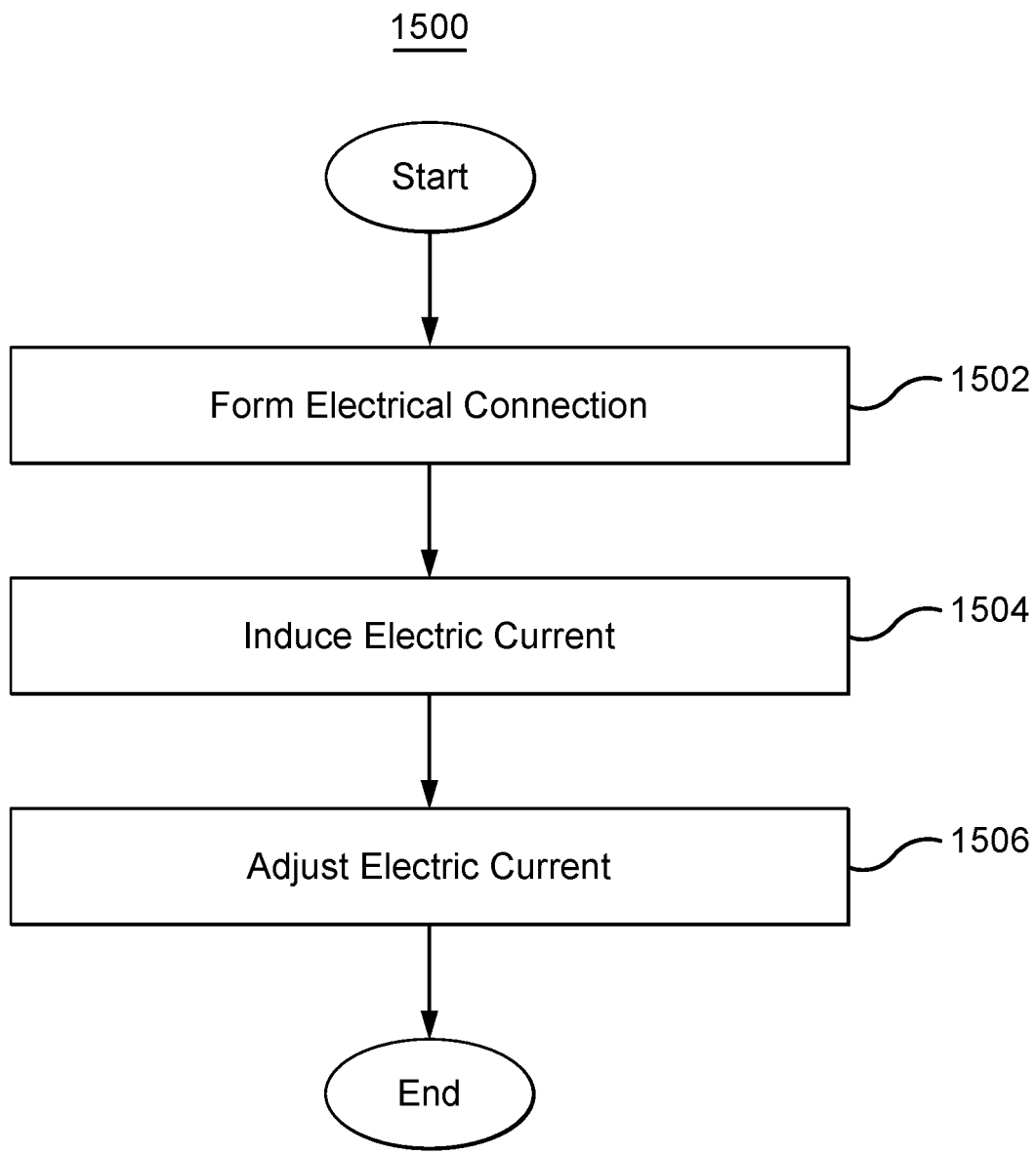
FIG. 15 is a flowchart of an example process performed in the system of FIG. 10.

FIG. 15 is a flowchart of an example method 1500. In particular embodiments, different components of the system 1000 perform the method 1500. By performing the method 1500, electric power is wirelessly delivered to a pluggable module 205.

In block 1502, an electrical connection is formed between the pluggable module 205 and an electrical connector (e.g., an edge connector 225). For example, the pluggable module 205 may be inserted through a first end 1004 of a cage 1002. The electrical connector may be inserted through a second end 1006 of the cage 1002. The pluggable module 205 then forms an electrical connection with the electrical connector, as described herein.

In block 1504, the transmission circuit 1010 induces an electric current in a receiving circuit 1102 on or in the pluggable module 205. The transmission circuit 1010 may be positioned on or in any suitable component in the system 1000. For example, the transmission circuit 1010 may be positioned on or in the cage 1002, the electrical connector, or the heatsink 1008 on the cage 1002. When the pluggable module 205 is positioned in the cage 1002 (e.g., in block 1502), the transmission circuit 1010 is brought near the receiving circuit 1102 on or in the pluggable module 205. The transmission circuit 1010 then induces an electric current in the receiving circuit 1102. Specifically, the coil 1214 in the transmission circuit 1010 induces a current in the coil 1302 in the receiving circuit 1102. The induced current is then used to power the pluggable module 205.

In block 1506, the transmission circuit 1010 adjusts the electric current induced in the receiving circuit 1102. For example, the power controller 1208 in the transmission circuit 1010 may change the power source 1202 or power sources 1202 connected to the transmission circuit 1010 to adjust the amount of electric power or a frequency of the signal provided to the transmission circuit 1010. The change in electric power or frequency changes the amount of current in the coil 1214 of the transmission circuit 1010, which changes the current induced in the receiving circuit 1102. As another example, the power controller 1208 may adjust the modulation of the signal provided by the power source 1202, which also adjusts the current induced in the coil 1214.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. A system comprising:
   a cage comprising a first end and a second end opposite the first end, wherein the first end is arranged to receive an electrical connector, and wherein the second end is arranged to receive a pluggable module such that the electrical connector forms an electrical connection with the pluggable module, wherein the electrical connector defines an interior volume and comprises (i) an external surface defining a plurality of cable openings each configured to receive a respective multi-conductor cable therethrough and (ii) a plurality of passageways, wherein each passageway corresponds to a respective cable opening of the plurality of cable openings; and
   a first coil positioned on or in the cage such that the first coil is arranged to deliver electric power to the pluggable module by inducing an electric current in a second coil positioned in or on the pluggable module when the pluggable module is connected to the electrical connector in the cage.

2. The system of claim 1, further comprising a power controller arranged to adjust the electric current induced by the first coil in the second coil.

3. The system of claim 1, wherein the second coil is electrically connected to a notch filter arranged to adjust a voltage delivered by the electric current.

4. The system of claim 1 further comprising a heatsink positioned on the cage such that the heatsink absorbs heat from the pluggable module when the pluggable module is positioned in the cage.

5. The system of claim 1, wherein each passageway of the plurality of passageways comprises:

a respective first section extending into the interior volume from the respective cable opening, wherein the first sections of the plurality of passageways are parallel with each other; and a respective second section extending from the respective first section toward a first plane of the pluggable module when the pluggable module is positioned in the interior volume.

6. The system of claim 5, wherein the electrical connector further comprises a plurality of cable terminators each configured to couple with a respective multi-conductor cable exiting the second section of a respective passageway, wherein each cable terminator comprises a plurality of pins each configured to couple with a respective conductor of the multi-conductor cable and to extend to a respective contact surface, wherein the contact surfaces of the plurality of cable terminators extend to a second plane, wherein the first plane and the second plane are coplanar when the pluggable module is positioned in the interior volume.

7. The system of claim 5, wherein the electrical connector body further comprises:

a second plurality of passageways, wherein each passageway of the second plurality of passageways corresponds to a respective cable opening of the plurality of cable openings and comprises a respective first section extending into the interior volume from the respective cable opening, wherein the first sections of the second plurality of passageways are parallel with each other and with the first sections of the first plurality of passageways; and a second plurality of cable terminators each configured to couple with a respective multi-conductor cable exiting the first section of a respective passageway of the second plurality of passageways, wherein each cable terminator of the second plurality of cable terminators comprises a plurality of pins each configured to couple with a respective conductor of the multi-conductor cable and to extend to a respective contact surface, wherein the contact surfaces of the second plurality of cable terminators extend to the second plane.

8. A system comprising:

a cage comprising a first end and a second end opposite the first end, wherein the first end is arranged to receive an electrical connector, and wherein the second end is arranged to receive a pluggable module such that the electrical connector forms an electrical connection with the pluggable module, wherein the electrical connector defines an interior volume and comprises (i) an external surface defining a plurality of cable openings each configured to receive a respective multi-conductor cable therethrough and (ii) a plurality of passageways, wherein each passageway corresponds to a respective cable opening of the plurality of cable openings;

a heatsink positioned on the cage, the heatsink arranged to absorb heat from the pluggable module when the pluggable module is positioned in the cage; and a first coil positioned on or in the heatsink such that the first coil is arranged to deliver electric power to the pluggable module by inducing an electric current in a second coil positioned in or on the pluggable module when the pluggable module is connected to the electrical connector in the cage.

9. The system of claim 8, further comprising a power controller arranged to adjust the electric current induced by the first coil in the second coil.

10. The system of claim 8, wherein the second coil is electrically connected to a notch filter arranged to adjust a voltage delivered by the electric current.

11. The system of claim 8, wherein each passageway of the plurality of passageways comprises:

a respective first section extending into the interior volume from the respective cable opening, wherein the first sections of the plurality of passageways are parallel with each other; and a respective second section extending from the respective first section toward a first plane of the pluggable module when the pluggable module is positioned in the interior volume.

12. The system of claim 11, wherein the electrical connector further comprises a plurality of cable terminators each configured to couple with a respective multi-conductor cable exiting the second section of a respective passageway, wherein each cable terminator comprises a plurality of pins each configured to couple with a respective conductor of the multi-conductor cable and to extend to a respective contact surface, wherein the contact surfaces of the plurality of cable terminators extend to a second plane, wherein the first plane and the second plane are coplanar when the pluggable module is positioned in the interior volume.

13. The system of claim 12, wherein the electrical connector further comprises:

a second plurality of passageways, wherein each passageway of the second plurality of passageways corresponds to a respective cable opening of the plurality of cable openings and comprises a respective first section extending into the interior volume from the respective cable opening, wherein the first sections of the second plurality of passageways are parallel with each other and with the first sections of the first plurality of passageways; and a second plurality of cable terminators each configured to couple with a respective multi-conductor cable exiting the first section of a respective passageway of the second plurality of passageways, wherein each cable terminator of the second plurality of cable terminators comprises a plurality of pins each configured to couple with a respective conductor of the multi-conductor cable and to extend to a respective contact surface, wherein the contact surfaces of the second plurality of cable terminators extend to the second plane.

14. A system comprising:

a cage comprising a first end and a second end opposite the first end, wherein the first end is arranged to receive an electrical connector, and wherein the second end is arranged to receive a pluggable module such that the electrical connector forms an electrical connection with the pluggable module; and a first coil positioned on or in the electrical connector such that the first coil is arranged to deliver electric power to the pluggable module by inducing an electric current in a second coil positioned in or on the pluggable module when the pluggable module is connected to the electrical connector in the cage.

15. The system of claim 14, further comprising a power controller arranged to adjust the electric current induced by the first coil in the second coil.

16. The system of claim 14, wherein the second coil is electrically connected to a notch filter arranged to adjust a voltage delivered by the electric current.

17. The system of claim 14 further comprising a heatsink positioned on the cage such that the heatsink absorbs heat from the pluggable module when the pluggable module is positioned in the cage.

18. The system of claim 14, wherein the electrical connector comprises:
- a connector body defining an interior volume, the connector body comprising:
    - an external surface defining a plurality of cable openings each configured to receive a respective multi-conductor cable therethrough; and
- a plurality of passageways, wherein each passageway corresponds to a respective cable opening of the plurality of cable openings.

\* \* \* \* \*

UNITED STATES PATENT AND TRADEMARK OFFICE
CERTIFICATE OF CORRECTION

PATENT NO. : 12,142,861 B2
APPLICATION NO. : 18/163125
DATED : November 12, 2024
INVENTOR(S) : Mark C. Nowell et al.

Page 1 of 1

It is certified that error appears in the above-identified patent and that said Letters Patent is hereby corrected as shown below:

On the Title Page

In item (63), in Column 1, in "Related U.S. Application Data", Line 1, delete "Continuation" and insert -- Continuation-in-part --.

In the Specification

In Column 1, Lines 41-42, delete "limiting," and insert -- limiting; --.

In Column 6, Line 21, delete "335-1, ... 335-4" and insert -- 335-1, ..., 335-4 --.

In the Claims

In Column 15, Line 21, in Claim 7, delete "claim 5," and insert -- claim 6, --.

In Column 15, Line 22, in Claim 7, before "further" delete "body".

Signed and Sealed this
Eighteenth Day of February, 2025

Coke Morgan Stewart
*Acting Director of the United States Patent and Trademark Office*